(12) United States Patent
Wang et al.

(10) Patent No.: US 11,367,716 B2
(45) Date of Patent: Jun. 21, 2022

(54) DISPLAY ASSEMBLY WITH A HEAT DISSIPATION LAYER, DISPLAY DEVICE, AND MANUFACTURING METHOD OF THE SAME DISPLAY

(71) Applicants: Chengdu BOE Optoelectronics Technology Co., Ltd., Sichuan (CN); BOE Technology Group Co., Ltd., Beijing (CN)

(72) Inventors: Li Wang, Beijing (CN); Wenfeng Guo, Beijing (CN); Jing Wang, Beijing (CN); Chengyi Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 16/530,341

(22) Filed: Aug. 2, 2019

(65) Prior Publication Data

US 2020/0273849 A1    Aug. 27, 2020

(30) Foreign Application Priority Data

Feb. 27, 2019  (CN) .......................... 201910145897.X

(51) Int. Cl.
*H01L 51/52* (2006.01)
*H01L 25/18* (2006.01)
(Continued)

(52) U.S. Cl.
CPC .......... *H01L 25/18* (2013.01); *G06V 40/1318* (2022.01); *H01L 25/50* (2013.01); *H01L 51/529* (2013.01)

(58) Field of Classification Search
CPC .... G06K 9/0004; G06K 9/0002; G06F 3/042; H01L 23/3672
See application file for complete search history.

(56) References Cited

U.S. PATENT DOCUMENTS

2016/0203353 A1   7/2016  Lee et al.
2017/0061193 A1*  3/2017  Young ................. G06K 9/0002
(Continued)

FOREIGN PATENT DOCUMENTS

CN   102033664 A    4/2011
CN   103347380 A   10/2013
(Continued)

OTHER PUBLICATIONS

Chinese Office Action dated Jul. 27, 2020 corresponding to application No. 201910145897.X.

*Primary Examiner* — Yuzhen Shen
(74) *Attorney, Agent, or Firm* — Nath, Goldberg & Meyer; Joshua B. Goldberg

(57) ABSTRACT

The present disclosure provides a display assembly, a display device including the display assembly, and a manufacturing method of the display device. The display assembly includes: a display panel having a display surface with a fingerprint detection area, and a back surface facing away from the display surface; and a carrier adhesive including a binding surface and a grooved surface facing away from the binding surface, wherein the carrier adhesive is provided with a carrier groove having an opening formed on the grooved surface, the binding surface is attached to the back surface of the display panel and the carrier groove is opposite to the fingerprint detection area.

19 Claims, 3 Drawing Sheets

(51) Int. Cl.
*H01L 25/00* (2006.01)
*G06V 40/13* (2022.01)

(56) References Cited

U.S. PATENT DOCUMENTS

| | | | | |
|---|---|---|---|---|
| 2017/0372115 A1* | 12/2017 | Lee | .................. | G06K 9/0002 |
| 2018/0293420 A1* | 10/2018 | Kim | .................. | G06F 3/0421 |
| 2019/0073505 A1* | 3/2019 | Kwon | .................. | G06K 9/0004 |
| 2019/0197944 A1* | 6/2019 | Kim | .................. | G09G 3/30 |
| 2020/0045826 A1* | 2/2020 | Wang | .................. | G06F 1/1658 |

FOREIGN PATENT DOCUMENTS

| | | |
|---|---|---|
| CN | 106292080 A | 1/2017 |
| CN | 206876999 U | 1/2018 |
| CN | 207148869 U | 3/2018 |
| CN | 207557608 U | 6/2018 |
| CN | 108334841 A | 7/2018 |
| CN | 108549499 A | 9/2018 |
| CN | 108962025 A | 12/2018 |
| CN | 108984022 A | 12/2018 |
| CN | 109273513 A | 1/2019 |

\* cited by examiner

DISPLAY ASSEMBLY WITH A HEAT DISSIPATION LAYER, DISPLAY DEVICE, AND MANUFACTURING METHOD OF THE SAME DISPLAY

CROSS-REFERENCE TO RELATED APPLICATION

This application claims priority from Chinese patent application No. 201910145897.X filed with the China National Intellectual Property Administration on Feb. 27, 2019, the disclosure of which is incorporated herein by reference in its entirety.

TECHNICAL FIELD

The present disclosure relates to a technical field of display devices, and particularly relates to a display assembly, a display device including the display assembly, and a manufacturing method of the display device.

BACKGROUND

With the development of microelectronic technology, more and more functions are integrated on display devices. In order to improve security of display devices, a detection sensor for identifying a fingerprint is typically integrated in display devices. However, when a conventional display device is put into an environmental reliability test, a display panel tends to be deformed, and an indentation at the detection sensor is clearly visible from a light emitting side of the display panel, thereby affecting the appearance of the display device.

As a result, how to eliminate the indentation at the detection sensor has become an urgent technical problem to be solved in the art.

SUMMARY

An object of the present disclosure is to provide a display assembly, a display device including the display assembly, and a manufacturing method of the display device. The display device according to the present disclosure has no significant, if any, indentation at a detection sensor for identifying a fingerprint so that the display device has a better appearance.

According to an aspect of the present disclosure, there is provided a display assembly, including:

a display panel having a display surface with a fingerprint detection area, and a back surface facing away from the display surface; and a carrier adhesive including a binding surface and a grooved surface facing away from the binding surface, wherein the carrier adhesive is provided with a carrier groove having an opening on the grooved surface, the binding surface is contact with the back surface of the display panel and the carrier groove is opposite to the fingerprint detection area.

In some embodiments, a bottom wall of the carrier groove is provided with a light-transmitting hole that penetrates the bottom wall in a direction perpendicular to the display panel, the light-transmitting hole is in communication with the carrier groove.

In some embodiments, the carrier adhesive includes a first carrier adhesive and a second carrier adhesive disposed on the first carrier adhesive, a surface of the first carrier adhesive is the binding surface of the carrier adhesive.

In some embodiments, the light-transmitting hole is disposed in the first carrier adhesive, and the carrier groove is disposed in the second carrier adhesive.

In some embodiments, the first carrier adhesive has a thickness smaller than the second carrier adhesive.

In some embodiments, the display assembly further includes a heat dissipation layer provided on the back surface of the display panel, the heat dissipation layer being provided with a receiving hole, at least a portion of the carrier adhesive is placed into the receiving hole.

In some embodiments, the heat dissipation layer includes a protruding bottom wall parallel to the back surface of the display panel, a portion of the bottom wall of the carrier groove is disposed on the protruding bottom wall.

In some embodiments, the protruding bottom wall is provided with a plurality of openings, and the bottom wall of the carrier groove is provided with a plurality of protrusions, the plurality of protrusions are inserted into the plurality of openings and in contact with the back surface of the display panel.

In some embodiments, a surface of the heat dissipation layer facing away from the back surface is flush with the grooved surface.

In some embodiments, the display assembly further includes a protective cover plate covering the display surface.

In some embodiments, the display panel includes an organic light emitting diode display panel.

According to another aspect of the present disclosure, there is provided a display device, including:

the display assembly as described above; and a detection sensor having an identification surface and configured to generate a fingerprint identification signal according to a brightness of light received by the identification surface, at least a portion of the detection sensor being fixedly disposed in the carrier groove with the identification surface facing the binding surface.

In some embodiments, the detection sensor has a mounting surface flush with the grooved surface, and the display device further includes at least one adhesive dispensing part, the adhesive dispensing part has one portion disposed on the grooved surface and the other portion disposed on the mounting surface so that the detection sensor is bonded to the carrier adhesive.

In some embodiments, the detection sensor includes a first mounting part and a second mounting part, the first mounting part includes the mounting surface, and is disposed in the carrier groove, a surface of the first mounting part facing away from the mounting surface is contact with a bottom surface of the carrier groove, and the second mounting part is disposed on the mounting surface so that the second mounting part is located outside the carrier groove, and the other portion of the adhesive dispensing part is disposed on a portion between an edge of a surface of the second mounting part attached to the mounting surface and an edge of the mounting surface so that the first mounting part is bonded to the carrier adhesive.

In some embodiments, the adhesive dispensing part is hemispherical.

In some embodiments, the display device further includes a fingerprint identification module configured to receive the fingerprint identification signal and determine a fingerprint topography based on the fingerprint identification signal.

According to still another aspect of the present disclosure, there is provided a manufacturing method of a display device, including:

providing a display panel that has a display surface and a back surface facing away from the display surface, the display surface being provided with a fingerprint detection area;

attaching a binding surface of the carrier adhesive to the back surface of the display panel at a position corresponding to the fingerprint detection area, wherein the carrier adhesive includes a grooved surface facing away from the binding surface, and the carrier adhesive is provided with a carrier groove having an opening formed on the grooved surface; and providing a detection sensor with an identification surface in the carrier groove, the detection sensor being configured to generate a fingerprint identification signal according to a brightness of light received by the identification surface, and the identification surface facing the binding surface.

In some embodiments, the step of attaching the binding surface of the carrier adhesive to the back surface of the display panel at the position corresponding to the fingerprint detection area includes:

providing a first carrier adhesive on the back surface of the display panel at the position corresponding to the fingerprint detection area, the first carrier adhesive being provided with a light-transmitting hole that penetrates the first carrier adhesive along a thickness direction of the first carrier adhesive; and providing a second carrier adhesive on the first carrier adhesive, the second carrier adhesive being provided with the carrier groove that penetrates the second carrier adhesive along a thickness direction of the second carrier adhesive, the carrier groove being in communication with the light-transmitting hole.

In some embodiments, the first carrier adhesive has a thickness smaller than the second carrier adhesive.

In some embodiments, the detection sensor has a mounting surface flush with the grooved surface, and after the step of providing the detection sensor in the carrier groove, the manufacturing method further includes:

providing at least one adhesive dispensing part, the adhesive dispensing part having one portion disposed on the grooved surface and the other portion disposed on the mounting surface so that the detection sensor is bonded to the carrier adhesive.

BRIEF DESCRIPTION OF DRAWINGS

Accompanying drawings are provided for further understanding of this disclosure and constitute a part of the description. Hereinafter, these drawings are intended to explain the disclosure together with the following exemplary embodiments, but should not be considered as a limitation of the disclosure, in which:

FIG. 2b is a schematic view of a variation of the display assembly shown in FIG. 2a;

FIG. 2c is a schematic view of another variation of the display assembly shown in FIG. 2a;

DETAILED DESCRIPTION

Hereinafter, exemplary embodiments of the disclosure will be described with respect to the accompanying drawings. It should be understood that the exemplary embodiments as set forth herein are merely for the purpose of illustration and explanation of the disclosure and should not be constructed as a limitation thereof.

Figure 1:
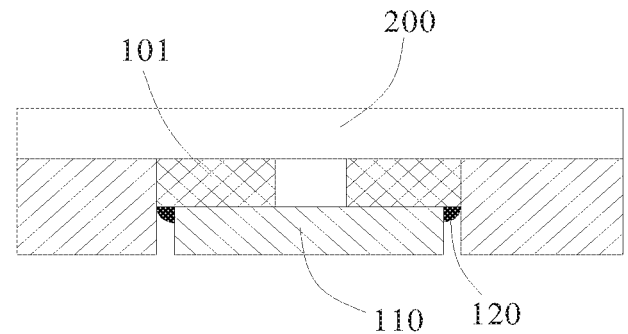
FIG. 1 is a schematic view of a display device according to an exemplary embodiment of the disclosure.

According to an aspect of the present disclosure, there is provided a display device. FIG. 1 is a schematic view of a display device according to an exemplary embodiment of the disclosure. The display device includes a display assembly and a detection sensor 110 having an identification surface integrated in the display assembly. The display assembly includes a sealant 101 by which the detection sensor 110 is bonded to a display panel 200. In order to firmly secure the detection sensor 110 onto the sealant 101, an adhesive dispensing part 120 is provided around the detection sensor 110. As shown in FIG. 1, the sealant 101 is relatively thinner, the detection sensor 110 is entirely disposed on the sealant 101, and, between an edge of the sealant 101 and an edge of the detection sensor 110, there is a gap within which the adhesive dispensing part 120 is disposed.

Figure 2A:
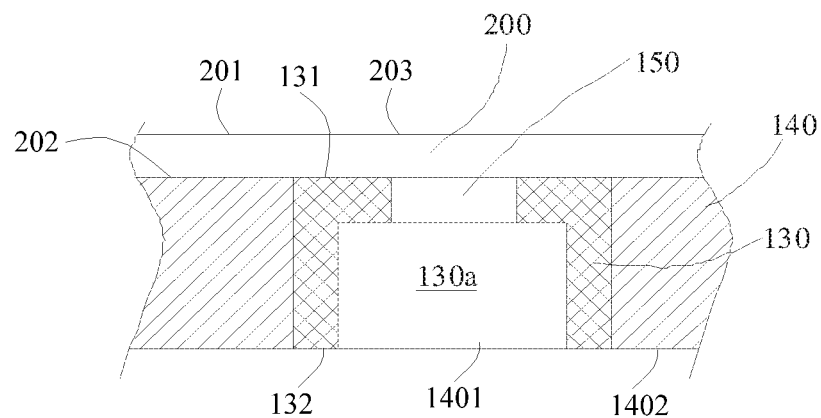
FIG. 2a is a partial schematic view of a display assembly according to an exemplary embodiment of the disclosure.

According to another aspect of the disclosure, there is provided a display assembly. As shown in FIG. 2a, the display assembly includes a display panel 200. The display panel 200 includes a display surface 201 and a back surface 202 facing away from the display surface 201. The display surface 201 is provided with a fingerprint detection area 203. The display assembly further includes a carrier adhesive 130 having a binding surface 131 and a grooved surface 132 facing away from the binding surface 131. The carrier adhesive 130 is provided with a carrier groove 130a having an opening formed on the grooved surface 132. The binding surface 131 is attached to the back surface 202 of the display panel 200 and the carrier groove 130a is opposite to the fingerprint detection area 203.

Figure 3:
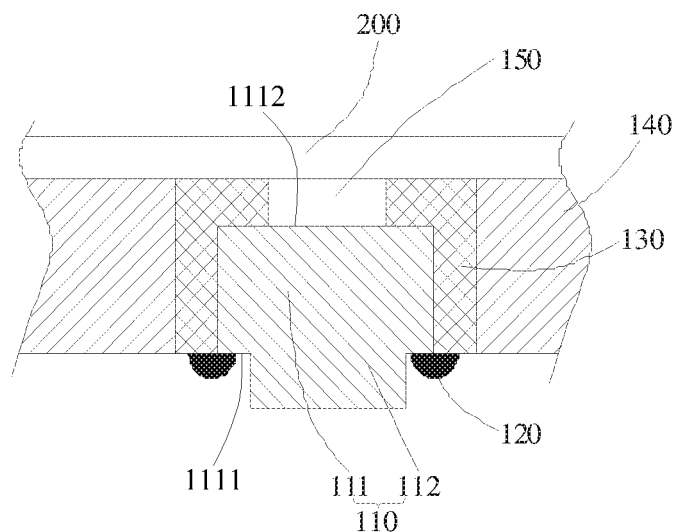
FIG. 3 is a partial schematic view of a display device according to an exemplary embodiment of the disclosure.

In an exemplary embodiment of the disclosure, as shown in FIG. 3, the display assembly is used in cooperation with the detection sensor 110 having an identification surface 1112. Specifically, the detection sensor 110 is fixedly disposed in the carrier groove 130a with the identification surface 1112 facing the binding surface 131.

When the display device including the display assembly and the detection sensor 110 is put into a environmental reliability test, the carrier adhesive 130 becomes thick enough to form the carrier groove 130a so that a stress generated by deformation of the carrier adhesive 130 can be released. Moreover, after the detection sensor 110 is disposed in the carrier groove 130a, a contact area between the detection sensor 110 and the carrier adhesive 130 is large enough to alleviate incoordination between the detection sensor 110 and the carrier adhesive 130 during deformation. Therefore, no significant indentation is visible when observed from one side of the display surface 201.

In an exemplary embodiment of the present disclosure, the detection sensor 110 is a photoelectric fingerprint identification sensor for generating a fingerprint identification signal according to a brightness of light received by the identification surface 1112.

In order to identify a fingerprint, a finger is required to cover a position on the display surface 201 of the display panel 200 that is directly opposite to the detection sensor 110. After light emitted from a pixel unit of the display device 200 is illuminated on the finger, light reflected by the fingerprint passes through the display panel 200 before being received by the identification surface 1112, converted into a fingerprint identification signal by the detection sensor 110 and calculated by a fingerprint identification module of the display device to identify a fingerprint topography.

In an exemplary embodiment of the present disclosure, the specific principle of fingerprint identification performed by the detection sensor 110 is not particularly limited. For example, the detection sensor 110 may identify a fingerprint by means of "in-display pinhole fingerprint identification technology". The fingerprint detection area 203 is disposed in the display area of the display panel 200. Accordingly, a bottom wall 1301 (see FIG. 2*b*) of the carrier groove 130*a* is provided with a light-transmitting hole 150 that penetrates the bottom wall 1301 in a thickness direction and that is in communication with the carrier groove 130*a*. The light-transmitting hole 150 is disposed opposite to the detection sensor 110. When a fingerprint is detected, light emitted from a pixel unit of the display panel 200 is illuminated on the finger. Then, light reflected by the fingerprint passes through the light-transmitting hole 150 before being received at the identification surface 1112. With the light-transmitting hole 150, an imaging effect of the fingerprint may be optimized.

Figure 2B:
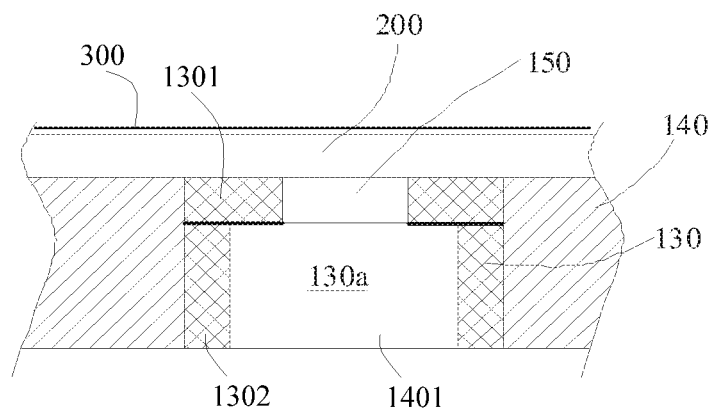

In an exemplary embodiment of the present disclosure, a variation of the display assembly shown in FIG. 2*a* is provided. As shown in FIG. 2*b*, the carrier adhesive 130 includes a first carrier adhesive 1301 (which may be regarded as a bottom wall of the carrier groove 130*a*) and a second carrier adhesive 1302 disposed on the first carrier adhesive 1301. One surface of the first carrier adhesive 1301 forms the binding surface 131 of the carrier adhesive 130, and the first carrier adhesive 1301 and the second carrier adhesive 1302 are made of the same material. Specifically, the carrier adhesive 130 shown in FIG. 2*a* is a one-piece member composed of only a single component in which the carrier groove 130*a* and the light-transmitting hole 150 in communication with each other are disposed along the thickness direction. In contrast, the carrier adhesive 130 shown in FIG. 2*b* is in the form of a multi-component member composed of the first carrier adhesive 1301 and the second carrier adhesive 1302. The light-transmitting hole 150 is disposed in the first carrier adhesive 1301 and the carrier groove 130*a* is disposed in the second carrier adhesive 1302. In order to reduce deformation of the carrier adhesive 130 composed of multiple components and improve the mounting accuracy, the first carrier adhesive 1301 and the second carrier adhesive 1302 are made of the same material so that the first carrier adhesive 1301 and the second carrier adhesive 1302 have the same coefficients of thermal expansion and contraction. In addition, as shown in FIG. 2*b*, the first carrier adhesive 1301 has a thickness smaller than the second carrier adhesive 1302 so that the lower and thinner first carrier adhesive 1301 may be used for control of an air layer Gap at the light-transmitting hole 150 to optimize the imaging effect. In an exemplary embodiment of the present disclosure, in order to prevent overheat of the display device during operation, as shown in FIGS. 2*a* and 2*b*, the display assembly further includes a heat dissipation layer 140 attached to the back surface 202 of the display panel 200, where the heat dissipation layer 140 is provided with a receiving hole 1401 into which the carrier adhesive 130 is received. The heat dissipation layer 140 may be made of a metal material having better heat dissipation performance (e.g., copper).

Figure 2C:
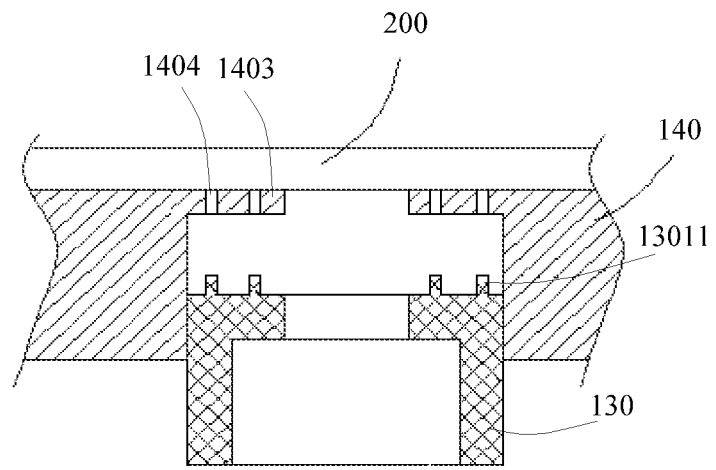

In an exemplary embodiment of the present disclosure, another variation of the display assembly shown in FIG. 2*a* is provided. As shown in FIG. 2*c*, the heat dissipation layer 140 includes a protruding bottom wall 1403 extending parallel to the back surface 202 of the display panel 200 (i.e., protruding toward the receiving hole 1401), and a portion of the bottom wall 1301 of the carrier groove 130*a* is disposed on the protruding bottom wall 1403. Specifically, a portion of the bottom wall 1301 is overlapped with the protruding bottom wall 1403 of the heat dissipation layer 140, so as to dissipate heat generated by a portion of the display panel around the light-transmitting hole 150 by the protruding bottom wall 1403 of the heat dissipation layer 140, thereby reducing thermal deformation of the display panel 200 and the carrier adhesive 130. As a result, no significant, if any, indentation at the detection sensor 110 is visible when observed from one side of the display surface 201, and thus the display device has a better appearance. In addition, as shown in FIG. 2*c*, the protruding bottom wall 1403 is provided with a plurality of openings 1404, and the bottom wall 1301 of the carrier groove 130*a* is provided with a plurality of protrusions 13011 inserted into the plurality of openings 1404 and in contact with the back surface 202 of the display panel 200. With this configuration, a portion of the carrier adhesive 130 may be attached to the back surface 202 of the display panel 200 while the heat dissipation capability of the display assembly around the light-transmitting hole 150 is improved, thereby reducing thermal deformation of the display panel 200 and the carrier adhesive 130.

In an exemplary embodiment of the present disclosure, in order to improve the aesthetic appearance of the display device, as shown in FIG. 2*a*, a surface 1402 of the heat dissipation layer 140 facing away from the back surface 202 of the display panel 200 is flush with the grooved surface 132 of the carrier adhesive 130.

Figure 4:
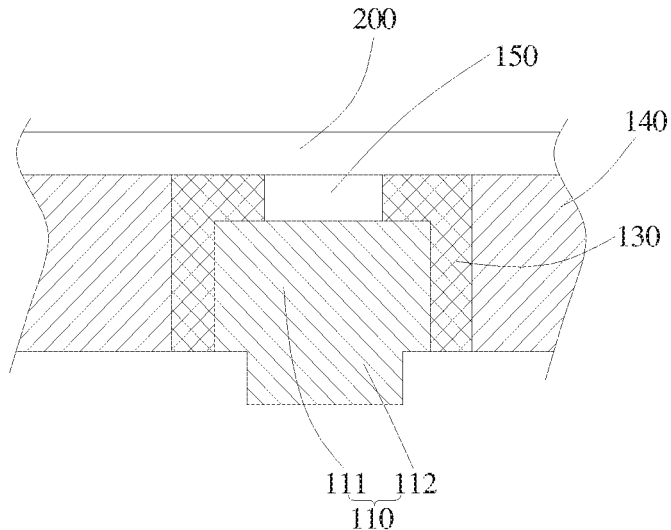
FIG. 4 is a schematic view showing a display device according to an exemplary embodiment of the disclosure in a state where an adhesive dispensing part is removed.

When the detection sensor 110 is mounted, the receiving hole 1401 is first opened on the heat dissipation layer 140, and then the detection sensor 110 is embedded into the receiving hole 1401, as shown in FIG. 4. Finally, the adhesive dispensing part 120 is provided to obtain the structure as shown in FIG. 3.

In an exemplary embodiment of the present disclosure, the specific structure of the display panel 200 is not particularly limited. For example, the display panel 200 may be an organic light emitting diode display panel.

According to another aspect of the present disclosure, there is provided a display device. As shown in FIG. 3, the display device includes a display assembly and a detection sensor 110 having an identification surface 1112. The detection sensor 110 is configured to generate a fingerprint identification signal according to a brightness of light received by the identification surface 1112. In an exemplary embodiment of the present disclosure, the display assembly is the above described display assembly provided by the present disclosure, at least a portion of the detection sensor 110 is fixedly disposed in the carrier groove 130*a*, and the identification surface 1112 faces the binding surface 131.

As described above, the carrier adhesive 130 is thick enough to form the carrier groove 130*a* so that a stress generated by deformation of the carrier adhesive 130 can be released. Moreover, after the detection sensor 110 is disposed in the carrier groove 130*a*, a contact area between the detection sensor 110 and the carrier adhesive 130 is large enough to alleviate incoordination between the detection sensor 110 and the carrier adhesive 130 during deformation.

Therefore, no significant indentation is visible when observed from one side of the display surface 201.

In an exemplary embodiment of the disclosure, as shown in FIG. 3, in order to fixedly connect the detection sensor 110 to the carrier adhesive 130, the detection sensor 110 has a mounting surface 1111 flush with the grooved surface 132, and the display device further includes at least one adhesive dispensing part 120 which has one portion disposed on the grooved surface 132 and the other portion disposed on the mounting surface 1111 so that the detection sensor 110 is bonded to the carrier adhesive 130.

The adhesive dispensing part 120 is located outside the carrier groove 130a so as to facilitate control of the shape and number of the adhesive dispensing parts 120 and thus further improve the aesthetic appearance of the display device.

In an exemplary embodiment of the present disclosure, the specific contour of the detection sensor 110 is not particularly limited. In the embodiment of FIG. 3, the detection sensor 110 includes a first mounting part 111 and a second mounting part 112, where the first mounting part 111 includes a mounting surface 1111. The first mounting part 111 is disposed in the carrier groove 130a, and a surface 1112 (i.e., the identification surface) of the first mounting part 111 facing away from the mounting surface 1111 is attached to a bottom surface of the carrier groove 130a. The second mounting part 112 is disposed on the mounting surface 1111 so that the second mounting part 112 is located outside the carrier groove 130a, and a gap is present between an edge of the surface of the second mounting part 112 attached to the mounting surface 1111 and an edge of the mounting surface 1111. That is, as shown in FIG. 3, a length of the second mounting part 112 in a horizontal direction is smaller than that of the first mounting part 111 so that the first mounting part 111 and the second mounting part 112 form a stepped configuration. That is, a shoulder for providing the adhesive dispensing part 120 is present on the first mounting part 111.

As an implementation, the first mounting part 111 may have a cylindrical shape, the second mounting part 112 may be a cylinder disposed on an end face 1111 of the first mounting part 111, the first mounting part 111 has a diameter larger than the second mounting part 112, and the second mounting part 112 and the first mounting part 111 are disposed coaxially. It should be understood that the configurations of the first mounting part 111 and the second mounting part 112 are not limited thereto, but may have any other suitable configuration as needed.

In an exemplary embodiment of the present disclosure, in order to reduce stress concentration at the adhesive dispensing part 120, the adhesive dispensing part 120 is hemispherical. Compared with the quarter-spherical adhesive dispensing part as shown in FIG. 1, the hemispherical adhesive dispensing part provided by the present disclosure is less prone to deformation. Therefore, it is further achieved that no significant, if any, indentation at the detection sensor 110 is visible when observed from one side of the display surface 201, and thus the display device has a better appearance.

In an exemplary embodiment of the present disclosure, in order to further reduce indentations, the mounting surface 1111 is flush with the grooved surface 132.

In an exemplary embodiment of the present disclosure, in order to better protect the display surface 201 of the display panel 200, as shown in FIG. 2b, the display device further includes a protective cover plate 300 covering the display surface 201 of the display panel 200.

The protective cover plate 300 is made of a transparent material (e.g., glass) and does not affect normal display of the display panel 200.

Since the carrier adhesive 130 is less likely to be deformed, when the display panel 200 is observed from the protective cover plate 300 side, almost no indentation is generated at the detection sensor 110.

In an exemplary embodiment of the present disclosure, in order to identify the fingerprint topography, the display device further includes a fingerprint identification module configured to receive the fingerprint identification signal and determine a fingerprint topography based on the fingerprint identification signal.

Figure 5:
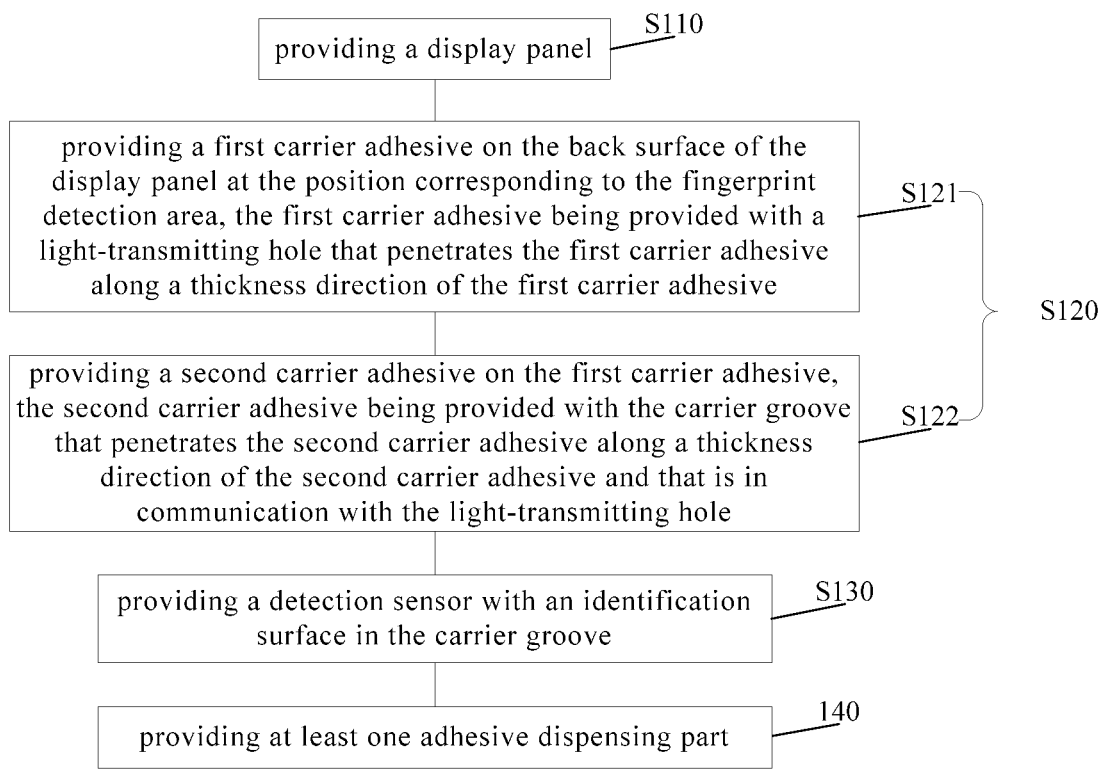
FIG. 5 is a flowchart of a manufacturing method according to an exemplary embodiment of the disclosure.

According to yet aspect of the present disclosure, there is provided a manufacturing method of the display device. As shown in FIG. 5, the manufacturing method includes:

at step S110, providing a display panel that has a display surface and a back surface facing away from the display surface, the display surface being provided with a fingerprint detection area;

at step S120, attaching a binding surface of the carrier adhesive to the back surface of the display panel at a position corresponding to the fingerprint detection area, wherein the carrier adhesive includes a grooved surface facing away from the binding surface, and the carrier adhesive is provided with a carrier groove having an opening formed on the grooved surface; and at step S130, providing a detection sensor with an identification surface in the carrier groove, the detection sensor being configured to generate a fingerprint identification signal according to a brightness of light received by the identification surface, and the identification surface facing the binding surface.

It should be further noted that, after the step S110 and the step S120, the display assembly provided by the present disclosure as described above can be obtained, and then the display device provided by the present disclosure can be obtained through the step S130. As described above, the carrier adhesive is thick enough to form the carrier groove so that a stress generated by deformation of the carrier adhesive can be released. In addition, after the detection sensor is disposed in the carrier groove, a contact area between the detection sensor and the carrier adhesive is large enough to alleviate incoordination between the detection sensor and the carrier adhesive during deformation. Therefore, no significant indentation is visible when observed from one side of the display surface.

In the exemplary embodiment of the present disclosure, how to obtain the carrier adhesive is not particularly limited. For example, the carrier groove may be formed by exposure development. Specifically, a transparent adhesive may be applied to the back side of the display panel, and then a halftone mask is used to expose and develop the transparent adhesive to obtain the carrier adhesive.

The carrier adhesive may also be obtained by transfer, inkjet printing or other methods.

In an exemplary embodiment of the present disclosure, in order to reduce cost and simplify the manufacturing process, the step S120 may include:

at step S121, providing a first carrier adhesive on the back surface of the display panel at the position corresponding to the fingerprint detection area, the first carrier adhesive being provided with a light-transmitting hole that penetrates the first carrier adhesive along a thickness direction of the first carrier adhesive; and at step S122, providing a second carrier adhesive on the first carrier adhesive, the second carrier adhesive being provided with the carrier groove that penetrates the second carrier adhesive along a thickness direction of the second carrier adhesive and that is in communication with the light-transmitting hole.

It should be noted that the second carrier adhesive has a thickness greater than the first carrier adhesive, and the carrier groove has an opening area greater than the light-transmitting hole. As described above, an imaging effect of the fingerprint may be optimized by means of the light-transmitting hole.

In the exemplary embodiment of the present disclosure, how the detection sensor is fixed in the carrier groove is not particularly limited. For example, the detection sensor may be fixed in the carrier groove by means of the adhesive dispensing part. Specifically, the detection sensor has a mounting surface flush with the grooved surface, after the step S130, the manufacturing method further includes:

at step S140, providing at least one adhesive dispensing part which has one portion disposed on the grooved surface and the other portion disposed on the mounting surface so that the detection sensor is bonded to the carrier adhesive.

Further, as described above, the detection sensor may include a first mounting part and a second mounting part, the first mounting part including a mounting surface. The first mounting part is disposed in the carrier groove, and a surface of the first mounting part facing away from the mounting surface is attached to a bottom surface of the carrier groove. The second mounting part is disposed on the mounting surface so that the second mounting part is located outside the carrier groove, and a gap is present between an edge of the surface of the second mounting part attached to the mounting surface and an edge of the mounting surface. One portion of the adhesive dispensing part is disposed on the grooved surface, while the other portion is disposed at the gap.

In an exemplary embodiment of the present disclosure, the adhesive dispensing part may be hemispherical, so that a stress inside of the adhesive dispensing part is reduced and thus deformation at the detection sensor is further avoided.

In an exemplary embodiment of the present disclosure, in order to improve the heat dissipation effect of the display device and prevent the display device from being overheated, the manufacturing method may, between the step S110 and the step S120, further include:

providing a heat dissipation layer on the back surface the display panel; and forming a receiving hole at a position on the heat dissipation layer corresponding to the fingerprint detection area.

Accordingly, in the step S120, the carrier adhesive is placed into the receiving hole.

It should be understood that the above embodiments are merely exemplary embodiments for the purpose of illustrating the principle of the present disclosure, and the present disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A display assembly, comprising:
a display panel having a display surface with a fingerprint detection area, and a back surface facing away from the display surface; and
a carrier adhesive comprising a binding surface and a grooved surface facing away from the binding surface, wherein the carrier adhesive is provided with a carrier groove having an opening on the grooved surface, the carrier groove is configured to receive a detection sensor, the binding surface is contact with the back surface of the display panel and the carrier groove is opposite to the fingerprint detection area,
wherein the display assembly further comprises a heat dissipation layer provided on the back surface of the display panel, the heat dissipation layer being provided with a receiving hole, at least a portion of the carrier adhesive is placed into the receiving hole, and
the heat dissipation layer comprises a protruding bottom wall extending on and parallel to the back surface of the display panel, the protruding bottom wall protrudes toward the receiving hole, the protruding bottom wall is in direct contact with the display panel, and at least a portion of the carrier groove, the carrier adhesive and the protruding bottom wall overlap in a direction perpendicular to the display panel,
wherein the protruding bottom wall is provided with a plurality of openings, and the bottom wall of the carrier groove is provided with a plurality of protrusions, the plurality of protrusions are inserted into the plurality of openings and in contact with the back surface of the display panel.

2. The display assembly according to claim 1, wherein a bottom wall of the carrier groove is provided with a light-transmitting hole that penetrates the bottom wall in a direction perpendicular to the display panel, the light-transmitting hole is in communication with the carrier groove.

3. The display assembly according to claim 2, wherein the carrier adhesive comprises a first carrier adhesive and a second carrier adhesive disposed on the first carrier adhesive, a surface of the first carrier adhesive is the binding surface of the carrier adhesive.

4. The display assembly according to claim 3, wherein the light-transmitting hole is disposed in the first carrier adhesive, and the carrier groove is disposed in the second carrier adhesive.

5. The display assembly according to claim 3, wherein the first carrier adhesive has a thickness smaller than the second carrier adhesive.

6. The display assembly according to claim 1, further comprising a heat dissipation layer provided on the back surface of the display panel, the heat dissipation layer being provided with a receiving hole, at least a portion of the carrier adhesive is placed into the receiving hole.

7. The display assembly according to claim 6, wherein the heat dissipation layer comprises a protruding bottom wall parallel to the back surface of the display panel, a portion of the bottom wall of the carrier groove is disposed on the protruding bottom wall.

8. The display assembly according to claim 6, wherein a surface of the heat dissipation layer facing away from the back surface is flush with the grooved surface.

9. The display assembly according to claim 1, further comprising a protective cover plate covering the display surface.

10. The display assembly according to claim 1, wherein the display panel comprises an organic light emitting diode display panel.

11. A display device, comprising:
the display assembly according to claim 1; and
a detection sensor having an identification surface and configured to generate a fingerprint identification signal according to a brightness of light received by the identification surface, at least a portion of the detection sensor being fixedly disposed in the carrier groove with the identification surface facing the binding surface.

12. The display device according to claim 11, wherein the detection sensor has a mounting surface flush with the grooved surface, and the display device further comprises at least one adhesive dispensing part, the adhesive dispensing part has one portion disposed on the grooved surface and the other portion disposed on the mounting surface so that the detection sensor is bonded to the carrier adhesive.

13. The display device according to claim 12, wherein the detection sensor comprises a first mounting part and a second mounting part, the first mounting part comprises the mounting surface and is disposed in the carrier groove, a surface of the first mounting part facing away from the mounting surface is contact with a bottom surface of the carrier groove, the second mounting part is disposed on the mounting surface so that the second mounting part is located outside the carrier groove, and the other portion of the adhesive dispensing part is disposed on a portion between an edge of a surface of the second mounting part attached to the mounting surface and an edge of the mounting surface so that the first mounting part is bonded to the carrier adhesive.

14. The display device according to claim 12, wherein the adhesive dispensing part is hemispherical.

15. The display device according to claim 11, further comprising a fingerprint identification circuit configured to receive the fingerprint identification signal and determine a fingerprint topography based on the fingerprint identification signal.

16. A manufacturing method of a display device, comprising:
providing a display panel that has a display surface and a back surface facing away from the display surface, the display surface being provided with a fingerprint detection area;
attaching a binding surface of a carrier adhesive to the back surface of the display panel at a position corresponding to the fingerprint detection area, wherein the carrier adhesive comprises a grooved surface facing away from the binding surface, and the carrier adhesive is provided with a carrier groove having an opening formed on the grooved surface;
providing a detection sensor with an identification surface in the carrier groove, the detection sensor being configured to generate a fingerprint identification signal according to a brightness of light received by the identification surface, and the identification surface facing the binding surface; and
providing a heat dissipation layer on the back surface the display panel, wherein the heat dissipation layer is provided with a receiving hole, at least a portion of the carrier adhesive is placed into the receiving hole, the heat dissipation layer comprises a protruding bottom wall extending on and parallel to the back surface of the display panel, the protruding bottom wall protrudes toward the receiving hole, the protruding bottom wall is in direct contact with the display panel, and at least a portion of the carrier groove, the carrier adhesive and the protruding bottom wall overlap in a direction perpendicular to the display panel,
wherein the protruding bottom wall is provided with a plurality of openings, and the bottom wall of the carrier groove is provided with a plurality of protrusions, the plurality of protrusions are inserted into the plurality of openings and in contact with the back surface of the display panel.

17. The manufacturing method according to claim 16, wherein the step of attaching the binding surface of the carrier adhesive to the back surface of the display panel at the position corresponding to the fingerprint detection area comprises:
providing a first carrier adhesive on the back surface of the display panel at the position corresponding to the fingerprint detection area, the first carrier adhesive being provided with a light-transmitting hole that penetrates the first carrier adhesive along a thickness direction of the first carrier adhesive; and
providing a second carrier adhesive on the first carrier adhesive, the second carrier adhesive being provided with the carrier groove that penetrates the second carrier adhesive along a thickness direction of the second carrier adhesive, the carrier groove being in communication with the light-transmitting hole.

18. The manufacturing method according to claim 17, wherein the first carrier adhesive has a thickness smaller than the second carrier adhesive.

19. The manufacturing method according to claim 16, wherein the detection sensor has a mounting surface flush with the grooved surface, and after the step of providing the detection sensor in the carrier groove, the manufacturing method further comprises:
providing at least one adhesive dispensing part, the adhesive dispensing part having one portion disposed on the grooved surface and the other portion disposed on the mounting surface so that the detection sensor is bonded to the carrier adhesive.

* * * * *